(12) United States Patent
Chen et al.

(10) Patent No.: US 12,727,139 B2
(45) Date of Patent: Sep. 1, 2026

(54) SEMICONDUCTOR STRUCTURE AND FABRICATION METHOD THEREOF

(71) Applicant: Semiconductor Manufacturing International (Shanghai) Corporation, Shanghai (CN)

(72) Inventors: Zhuofan Chen, Shanghai (CN); Jisong Jin, Shanghai (CN)

(73) Assignee: Semiconductor Manufacturing Intemational (Shanghai) Corporation, Shanghai (CN)

( * ) Notice: Subject to any disclaimer, the term of this patent is extended or adjusted under 35 U.S.C. 154(b) by 641 days.

(21) Appl. No.: 18/119,143

(22) Filed: Mar. 8, 2023

(65) Prior Publication Data

US 2023/0292483 A1 Sep. 14, 2023

(30) Foreign Application Priority Data

Mar. 14, 2022 (CN) ......................... 202210249910.8

(51) Int. Cl.

*H10B 10/00* (2023.01)
*H10D 64/01* (2025.01)
*H10D 64/27* (2025.01)
*H10W 20/41* (2026.01)

(52) U.S. Cl.

CPC ............. *H10B 10/12* (2023.02); *H10D 64/01* (2025.01); *H10D 64/017* (2025.01); *H10D 64/511* (2025.01); *H10W 20/435* (2026.01)

(58) Field of Classification Search

CPC ...... H10B 10/12; H10D 64/01; H10D 64/017; H10D 64/511; H10D 62/021; H10W 20/435; H10W 20/0698

See application file for complete search history.

(56) References Cited

U.S. PATENT DOCUMENTS

2017/0125425 A1* 5/2017 Chen ...................... H10B 41/35
2019/0288690 A1* 9/2019 Yeap .................. H03K 19/0013
2021/0408000 A1* 12/2021 Lin .................... H10D 84/0193

* cited by examiner

*Primary Examiner* — Dao H Nguyen
(74) *Attorney, Agent, or Firm* — Anova Law Group, PLLC

(57) ABSTRACT

A semiconductor structure and its fabrication method are provided. The semiconductor structure includes: a substrate including a base substrate with a first device region and a second device region; a first active region on the first device region and a second active region on the second device region; an isolation layer between the first active region and the second active region; and a first gate electrode and a second gate electrode on the substrate. The first active region includes a first functional region and a first shared region. The first gate electrode is located on the device region and on a portion of a surface of the first active region. The second gate electrode is located on the second device region and on a portion of a surface of the second active region; and the second gate electrode also extends to a surface of the first shared area.

20 Claims, 7 Drawing Sheets

SEMICONDUCTOR STRUCTURE AND FABRICATION METHOD THEREOF

CROSS-REFERENCE TO RELATED APPLICATION

This application claims the priority of Chinese Patent Application No. 202210249910.8, filed on Mar. 14, 2022, the content of which is incorporated herein by reference in its entirety.

TECHNICAL FIELD

The present disclosure generally relates to the field of semiconductor fabrication technology and, more particularly, relates to a semiconductor structure and its fabrication method.

BACKGROUND

With the continuous development of microelectronics technology, memory presents a development trend of high integration, high speed, and low power consumption. Compared with DRAM (Dynamic Random Access Memory), Static Random-Access Memory (SRAM) can save data stored inside without refreshing circuits. Also, DRAM requires regular scrubbing and charging at regular intervals, otherwise the internal data will disappear. Therefore, SRAM has better performance. SRAM has developed rapidly in recent years. As an important product in semiconductor memory, SRAM has been widely used in high-speed data exchange systems such as computers, communications, and multimedia.

However, SRAM has a lower integration level and requires a larger volume than the DRAM with the same capacity. Therefore, an important indicator of SRAM is its area. To improve the integration level, shared contact hole (Shared CT) technology is used to directly connect gate electrodes and active areas, to save area is achieved by shortening wiring.

To further reduce the size of memory cells, the existing shared contact hole formation technology needs to be further improved.

SUMMARY

One aspect of the present disclosure provides a semiconductor structure. The semiconductor structure includes: a substrate including a base substrate, wherein the base substrate includes a first device region and a second device region; a first active region on the first device region and a second active region on the second device region; an isolation layer between the first active region and the second active region; and a first gate electrode and a second gate electrode on the substrate, wherein: the first active region and the second active region extend along a first direction; the first active region includes a first functional region and a first shared region; the first gate electrode and the second gate electrode are parallel to a second direction, wherein the first direction and the second direction are perpendicular to each other; the first gate electrode is located on the device region and on a portion of a surface of the first active region; the second gate electrode is located on the second device region and on a portion of a surface of the second active region; and the second gate electrode also extends to a surface of the first shared area.

Optionally, the second active region includes a second functional region and a second shared region; and the first gate electrode also extends to a surface of the second shared region.

Optionally, the semiconductor structure further includes: first source/drain layers in the first active region at two sides of the first gate electrode; a first channel layer in the first active region under the first gate electrode and between the adjacent first source/drain layers; second source/drain layers in the second active region at two sides of the second gate electrode; and a second channel layer in the second active region under the second gate electrode and between the adjacent second source/drain layers.

Optionally, the semiconductor structure further includes: an interlayer dielectric layer on the substrate, where the first gate electrode and the second gate electrode are located; a first dielectric layer on the interlayer dielectric layer, including a plurality of contact layers respectively located on surfaces of the first gate electrode, the second gate electrode, the first source/drain layers, and the second source/drain layers; a second dielectric layer located on the first dielectric layer; and a metal interconnection layer inside the second dielectric layer. The metal interconnection layer and the plurality of contact layers are electrically connected.

Optionally, the first gate electrode is made of a material including metal or its derivatives, and the second gate electrode is made of a material including metal or its derivatives. The metal or its derivatives include titanium nitride, tantalum nitride, titanium, aluminum, tungsten, copper, lanthanide metal oxides or a combination thereof.

Another aspect of the present disclosure provides a fabrication method for forming a semiconductor structure. The method includes: providing a substrate including a base substrate, where the base substrate includes a first device region and a second device region; forming a first active region on the first device region and a second active region on the second device region; forming an isolation layer between the first active region and the second active region; and forming a first gate electrode and a second gate electrode on the substrate. The first active region and the second active region extend along a first direction. The first active region includes a first functional region and a first shared region. The first gate electrode and the second gate electrode are parallel to a second direction. The first direction and the second direction are perpendicular to each other. The first gate electrode is located on the device region and on a portion of a surface of the first active region. The second gate electrode is located on the second device region and on a portion of a surface of the second active region; and the second gate electrode also extends to a surface of the first shared area.

Optionally, the method further includes: forming first source/drain layers in the first active region at two sides of the first gate electrode, where there is a first channel layer in the first active region under the first gate electrode and between the adjacent first source/drain layers; and forming second source/drain layers in the second active region at two sides of the second gate electrode, where there is a second channel layer in the second active region under the second gate electrode and between the adjacent second source/drain layers. The first source/drain layers, the second source/drain layers, the first gate electrode, and the second gate electrode are formed by: forming the first source/drain layers in the first active region at two sides of the first dummy gate electrode; forming the second source/drain layers in the second active region at two sides of the second dummy gate electrodes; after the formation of the first source/drain layers and the second source/drain layers, forming an interlayer layer on the surface of the substrate, wherein the interlayer dielectric layer exposes the top surfaces of the first dummy gate electrode and the second dummy gate electrode; and after forming the interlayer dielectric layer, using the first gate electrode to replace the first dummy gate electrode a dummy gate electrode and using the second gate electrode to replace the second dummy gate electrode. The first dummy gate electrode and the second dummy gate electrode are parallel to the second direction; the first dummy gate electrode is located on the first device region and a portion of a surface of the first active region; the second dummy gate electrode is located on the second device region and a portion of a surface of the second active region; and the second dummy gate electrode also extends to the surface of the first shared region.

Optionally, after forming the first gate electrode and the second gate electrode, the method further includes: forming a first dielectric layer on the interlayer dielectric layer, where the first dielectric layer includes a plurality of contact layers respectively located on the surfaces of the first gate electrode, the second gate electrode, the first source/drain layers, and the second source/drain layers; and after forming the first dielectric layer, forming a second dielectric layer on the first dielectric layer. The second dielectric layer includes a metal interconnection layer; and the metal interconnection layer is electrically connected to the plurality of contact layers.

Optionally, using the first gate electrode to replace the first dummy gate electrode a dummy gate electrode and using the second gate electrode to replace the second dummy gate electrode includes: removing the first dummy gate electrode to form a first gate electrode groove in the interlayer dielectric layer; removing the second dummy gate electrode to form a second gate electrode groove in the interlayer dielectric layer; and forming the first gate electrode in the first gate electrode groove and the second gate electrode in the second gate electrode groove.

Optionally, forming the first gate electrode and the second gate electrode includes: forming a gate electrode material layer on surfaces of the first gate electrode groove, the second gate electrode groove, and the interlayer dielectric layer; and planarizing the gate electrode material layer to form the first gate electrode in the first gate electrode groove and the second gate electrode in the second gate electrode groove.

Optionally, the method further includes: forming a first gate electrode oxide layer between the first source/drain layers and the first gate electrode, and a first gate electrode dielectric layer on the first gate electrode oxide layer; and forming a second gate electrode oxide layer between the second source/drain layers and the second gate electrode, and a second gate electrode dielectric layer on the second gate electrode oxide layer.

Optionally, forming the first gate electrode oxide layer, the first gate electrode dielectric layer, the second gate electrode oxide layer, and the second gate electrode dielectric layer includes: before forming the gate electrode material layer, forming a gate electrode oxide material layer on the surfaces of the first gate electrode groove, the second gate electrode groove and the interlayer dielectric layer, and forming a gate electrode dielectric material layer on the gate electrode oxide material layer; removing a portion of the gate electrode oxide material layer and a portion of the gate electrode dielectric material layer on the first shared region exposed by the second gate electrode groove; and after forming the gate electrode material layer, planarizing the gate electrode dielectric material layer and the gate electrode oxide material layer until the interlayer dielectric layer is exposed, such that the first gate electrode oxide layer is formed from the gate electrode oxide material layer in the first gate electrode groove, the first gate electrode dielectric layer is formed from the gate electrode dielectric material layer in the first gate electrode groove, the second gate electrode oxide layer is formed from the gate electrode oxide material layer in the second gate electrode groove, and the second gate electrode dielectric layer is formed from the second gate electrode dielectric material layer in the second gate electrode groove.

Optionally, the portion of the gate electrode oxide material layer and the portion of the gate electrode dielectric material layer on the first shared region exposed by the second gate electrode groove are removed by a wet etching process.

Optionally, the portion of the gate electrode dielectric material layer on the first shared region exposed by the second gate electrode groove are removed using an etching solution including a mixed solution of hydrofluoric acid solution, hydrochloric acid solution and alcohol solution, wherein the ratio range of hydrofluoric acid solution, hydrochloric acid solution and alcohol solution is about 1:1:99 to about 1:20:80, concentration of the hydrofluoric acid solution is about 1% to about 10%, concentration of the hydrochloric acid solution is about 10% to about 40%, and concentration of the alcohol solution is about 50% to about 99%.

Optionally, the second active region includes a second functional region and a second shared region; and the first gate electrode further extends to a surface of the second shared region.

Optionally, after forming the gate electrode oxide material layer and the gate electrode dielectric material layer, the method further includes: removing a portion of the gate electrode oxide material layer and a portion of the gate electrode dielectric material layer on the second shared region exposed by the first gate electrode groove.

Optionally, the method further includes: forming an isolation layer between the first active region and the second active region.

Optionally, a top surface of the isolation layer is lower than top surfaces of the first active region and the second active region. The first active region, the second active region, and the isolation layer are formed by: etching the substrate to form the first active region, the second active region, and a groove between the first active region and the second active region; forming a dielectric material layer in the groove; and etching back the dielectric material layer to form the isolation layer.

Optionally, the first gate electrode is made of a material including metal or its derivatives, and the second gate electrode is made of a material including metal or its derivatives. The metal or its derivatives include titanium nitride, tantalum nitride, titanium, aluminum, tungsten, copper, lanthanide metal oxides or a combination thereof.

In the fabrication method of the semiconductor structure provided by various embodiments of the present disclosure, the first active region may include the first functional region and the first shared region. The second gate electrode may extend to the surface of the first shared region, and the second gate electrode and the first active region may be electrically connected in the device layer without occupying the space of the dielectric layer on the upper layer of the device layer. Therefore, the arrangement of metal interconnection wires in the subsequent process may not be affected, which may be beneficial to increase the device density. Further, the second active region includes the second functional region and the second shared region, and the first gate electrode may extend to the surface of the second shared region. The first gate electrode and the second active region may be electrically connected in the device layer without occupying the space of the dielectric layer on the upper layer of the device layer. Therefore, the arrangement of metal interconnection wires in the subsequent process may not be affected, which may be beneficial to increase the device density.

In the semiconductor structure provided by various embodiments of the present disclosure, the first active region may include the first functional region and the first shared region. The second gate electrode may extend to the surface of the first shared region, and the second gate electrode and the first active region may be electrically connected in the device layer without occupying the space of the dielectric layer on the upper layer of the device layer. Therefore, the arrangement of metal interconnection wires in the subsequent process may not be affected, which may be beneficial to increase the device density. Further, the second active region includes the second functional region and the second shared region, and the first gate electrode may extend to the surface of the second shared region. The first gate electrode and the second active region may be electrically connected in device layer without occupying the space of the dielectric layer on the upper layer of the device layer. Therefore, the arrangement of metal interconnection wires in the subsequent process may not be affected, which may be beneficial to increase the device density.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

It should be noted that "surface" or "upper" in this specification are used to describe the relative positional relationship in space, and are not limited to whether they are in direct contact.

Figure 1:
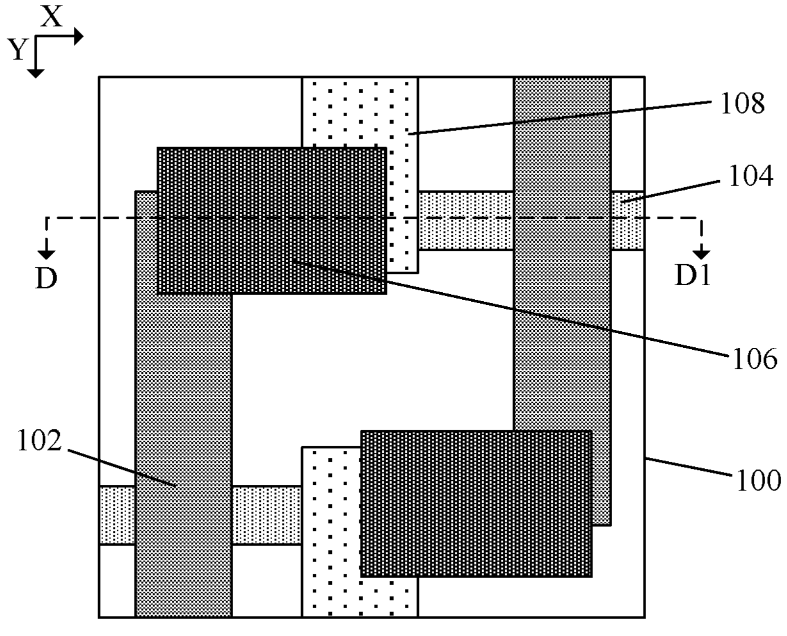
FIG. 1 and FIG. 2 illustrate a semiconductor structure.
Figure 2:
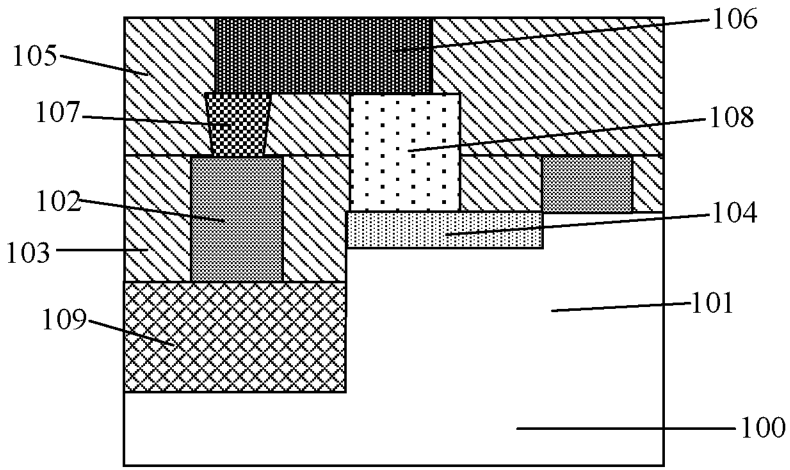

FIG. 1 and FIG. 2 illustrate a semiconductor structure. As shown in FIG. 1 which is a schematic top view structural view of a local area containing a shared contact hole in a static random read-write memory unit, FIG. 2 is a schematic cross-sectional structural view along the DD1 direction in FIG. 2, the semiconductor structure includes a substrate, gate electrodes 102, source/drain layers 104, an interlayer dielectric layer 103, a second dielectric layer 105, first contact holes, and second contact holes. The substrate includes a base substrate 100, fins 101 and an isolation layer 109 between adjacent fins 101. Each of the fins 101 extends along a first direction X. A top surface of the isolation layer 109 is lower than top surfaces of the fins 101. The gate electrodes 102 cross the fins 101 and extend along a second direction Y, and the second direction Y is perpendicular to the first direction X. The gate electrodes 102 are also located on a portion of sidewalls and top surfaces of the fins 101. The source/drain layers 104 are located in the fins 101 at two sides of each gate electrode 102. The interlayer dielectric layer 103 is located on the substrate, and on the side walls of the gate electrodes 102. The second dielectric layer 105 is located on the first dielectric layer 103, and include shared contact holes (not shown in the figure). Each first contact hole and a corresponding second contact hole are located below a corresponding shared contact hole. Each first contact hole exposes a portion of a corresponding gate electrode 102. The second contact holes are also located in the first dielectric layer 103, and each second contact hole exposes a portion of a top surface of a corresponding source-drain layer 104 is exposed. Each shared contact hole extends along the first direction X, and a shared contact layer 106 is provided inside the shared contact hole. A first conductive plug 107 is provided inside each first contact hole, and a second conductive plug 108 is provided in each second contact hole.

In this semiconductor structure, the shared contact layers 106 are used to connect the gate electrodes 102 and the source/drain layers 104, and are formed in the second dielectric layer 105 after the device layer is formed, that is, are formed in a middle-of-line (MOL) of the semiconductor process. In the subsequent process of forming the shared contact layers 106, a first metal interconnection layer will be formed on the second dielectric layer 105.

With the continuous shrinking of device feature size, without changing the thickness of the second dielectric layer 105, to form a considerable gap between the first metal interconnection layer and the shared contact layers 106 for separation, the feature size of the first metal interconnection layer needs to be reduced. One solution is to use extreme ultraviolet (EUV) lithography technology to reduce the feature size of the first metal interconnection layer. However, under the current circumstances, domestic EUV lithography technology is difficult to promote.

The present disclosure provides a semiconductor structure and its fabrication method, to at least partially alleviate the above problem. In the semiconductor structure and its fabrication method provided by the present disclosure, a first active region may include a first function region and a first shared region. A second gate electrode may extend to a surface of the first shared region, and the second gate electrode and the first active region may be electrically connected in a device layer. Therefore, a space of a dielectric layer on the device layer may not be occupied, and the arrangement of metal interconnection wirings in the back-end process, to improve device density.

The present disclosure provides a fabrication method of a semiconductor structure. FIGS. 3-14 illustrate semiconductor structures corresponding to certain stages of forming a semiconductor structure, and FIG. 15 illustrates a fabrication method of a semiconductor structure provided by one embodiment of the present disclosure.

Figure 3:
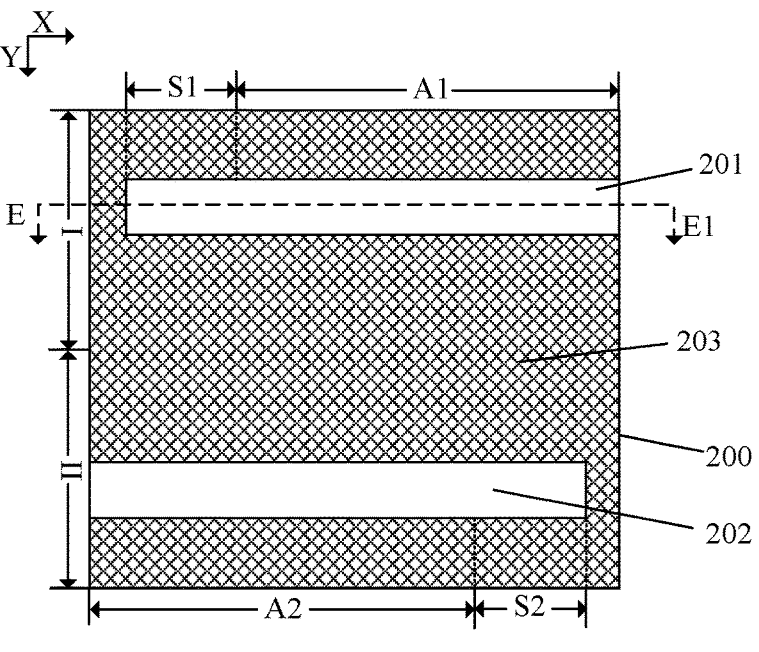
FIGS. 3-14 illustrate semiconductor structures corresponding to certain stages of forming an exemplary semiconductor structure according to various disclosed embodiments of the present disclosure.
Figure 4:
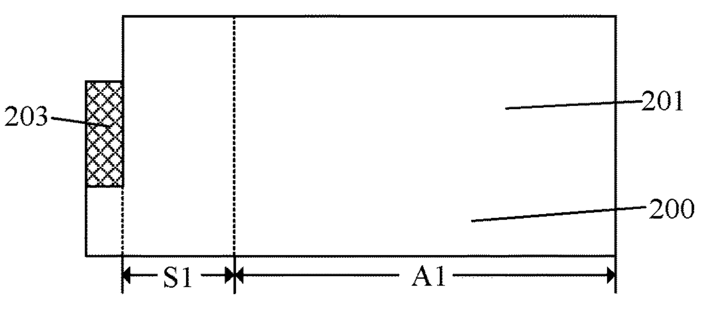

As shown in FIG. 3 which is a top view of FIG. 4, and FIG. 4 is a cross-sectional view along an EE1 direction in FIG. 3, a substrate may be provided. The substrate may include a base substrate 200, and the base substrate 200 may include a first device region I and a second device region II adjacent to each other; a first active region 201 on the first device region I, a second active region 202 on the second device region II, and an isolation layer 203 between the first active region 201 and the second active region 202. The first active region 201 may extend along a first direction X, and may include a first functional area A1 and a first shared area S1.

In one embodiment, the first active region 201 and the second active region 202 may be fin structures. In other embodiments, the first active region and the second active region may be planar structures or three-dimensional structures.

In one embodiment, the base substrate 200 may be made of silicon. In other embodiments, the base substrate 200 may be made of a material including silicon carbide, silicon germanium, multi-nary semiconductor materials composed of III-V group elements, silicon-on-insulator (SOI), or germanium-on-insulator (GOI). The multi-nary semiconductor materials composed of III-V group elements may include InP, GaAs, GaP, InAs, InSb, InGaAs or InGaAsP.

In one embodiment, the first active region 201 may be made of a material including silicon; and the second active region 202 may be made of a material including silicon. In other embodiments, the first active region 201 may be made of a material including silicon germanium; and the second active region 202 may be made of a material including silicon germanium.

In one embodiment, a top surface of the isolation layer 203 may be lower than the top surfaces of the first active region 201 and the second active region 202.

In one embodiment, the first active region 201 and the second active region 202 may be formed by: etching the substrate to form the first active region 201, the second active region 202, and a groove between the first active region 201 and the second active region 202; forming a dielectric material layer in the groove; and etching back the dielectric material layer, to form the isolation layer 203.

In one embodiment, the second active region 202 may include a second functional region A2 and a second shared region S2.

Subsequently, a first gate electrode and a second gate electrode may be formed on the base substrate 200. The first gate electrode and the second gate electrode may be parallel to a second direction Y, where the first direction X and the second direction Y are perpendicular to each other. The first gate electrode may be located on the first device region I and on a portion of the surface of the first active region 201, and the second gate electrode may be located on the second device region II and on a portion of the surface of the second active region 202. The second gate electrode may also extend to the surface of the first shared region S1.

In one embodiment, first source/drain layers may be provided in the first active region 201 located on two sides of the first gate electrode, and a first channel layer may be provided in the first active region below the first gate electrode and between the adjacent first source/drain layers. Second source/drain layers may be provided in the Second active region 202 located on two sides of the second gate electrode, and a second channel layer may be provided in the second active region below the first gate electrode and between the adjacent second source/drain layers.

In one embodiment, the first device region I may be used to form a first pull-up transistor of an SRAM device unit, and the second device region II may be used to form a second pull-up transistor of the SRAM device unit.

The first source/drain layers, the second source/drain layers, the first gate electrode, and the second gate electrode may be formed by the method shown in FIG. 5 to FIG. 14.

Figure 5:
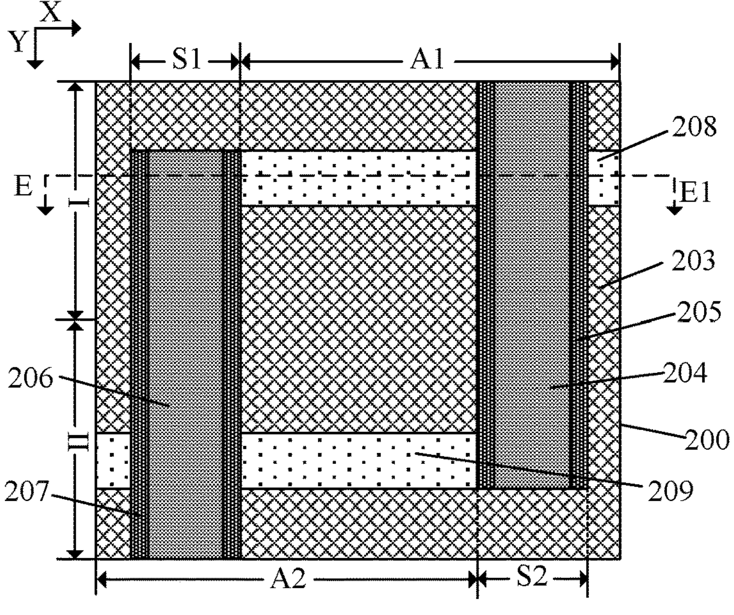
Figure 6:
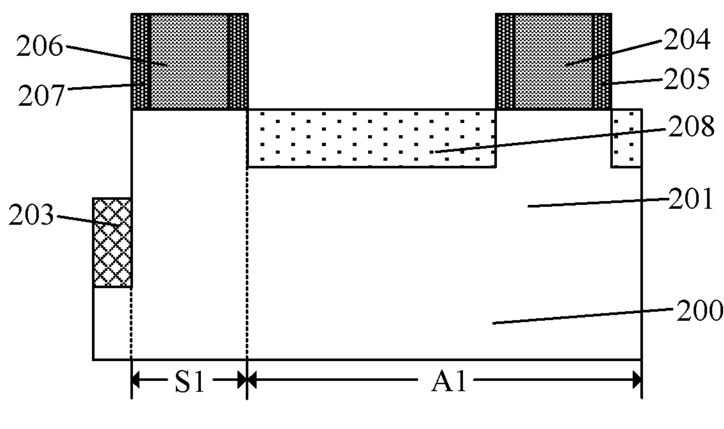

As shown in FIG. 5 which is a top view, and FIG. 6 is a cross-sectional view along the EE1 direction in FIG. 5, a first dummy gate electrode 204 and a second dummy gate electrode 206 may be formed on the base substrate 200. The first dummy gate electrode 204 and the second dummy gate electrode 206 may be parallel to the second direction Y. The first dummy gate electrode 204 may be located on the first device region I and on a portion of the surface of the first active region 201, and the second dummy gate electrode 206 may be located on the second device region II and on a portion of the surface of the second active region 202.

In one embodiment, the second dummy gate electrode 206 may also extend to the surface of the first shared region S1.

The first dummy gate electrode 204 may occupy a space for forming the first gate electrode; and the second dummy gate electrode 206 may occupy a space for forming the second gate electrode.

In one embodiment, a first spacer 205 may be formed on the sidewall of the first dummy gate electrode 204; and a second sidewall 207 may be formed on the sidewall of the second dummy gate electrode 206.

As shown in FIG. 5 and FIG. 6, the first source/drain layers 208 may be formed in the first active region 201 on both sides of the first dummy gate electrode 204; and the second source/drain layers 209 may be formed in the second active region 202 on both sides of the second dummy gate electrode 206.

In one embodiment, the first source/drain layers 208 may be formed by: forming first grooves in the first active region 201 on both sides of the first dummy gate electrode 204; forming first epitaxial layers in the first grooves; and implanting first dopant ions into the first epitaxial layers. A conductivity type of the first dopant ions may be P-type.

In one embodiment, the second source/drain layers 209 may be formed by: forming second grooves in the second active region 202 on both sides of the second dummy gate electrode 206; forming second epitaxial layers in the second grooves; and implanting second dopant ions into the second epitaxial layers. A conductivity type of the second dopant ions may be P-type.

Figure 7:
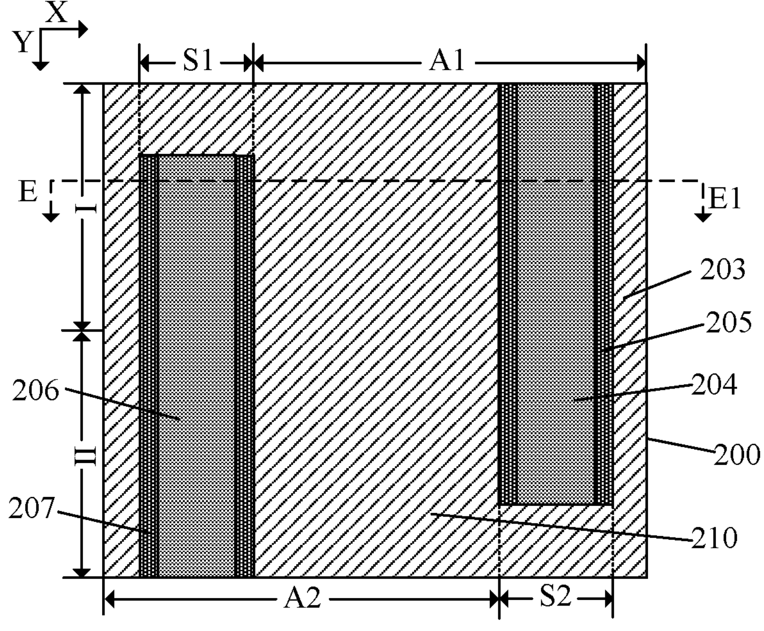
Figure 8:
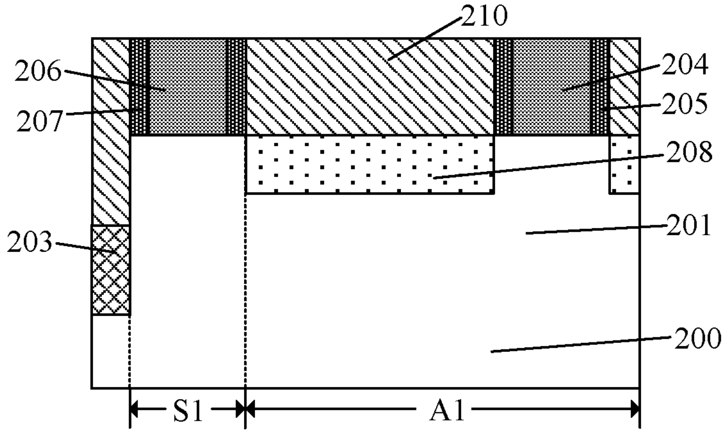

As shown in FIG. 7 which is a top view, and FIG. 8 is a cross-sectional view along the EE1 direction in FIG. 7, after forming the first source-drain layers 208 and the second source-drain layers 209, an interlayer dielectric layer 210 may be formed on the surface of the base substrate 200, and the interlayer dielectric layer 210 may expose the top surfaces of the first dummy gate electrode 204 and the second dummy gate electrode 206.

Subsequently, after forming the interlayer dielectric layer 210, the first dummy gate electrode 204 may be replaced with the first gate electrode; and after forming the interlayer dielectric layer 210, the second dummy gate electrode 206 may be replaced with the second gate electrode.

In one embodiment, the first dummy gate electrode 204 may be replaced with the first gate electrode; and, the second dummy gate electrode 206 may be replaced with the second gate electrode, by the method shown in FIG. 9 to FIG. 14.

Figures 9, 10:
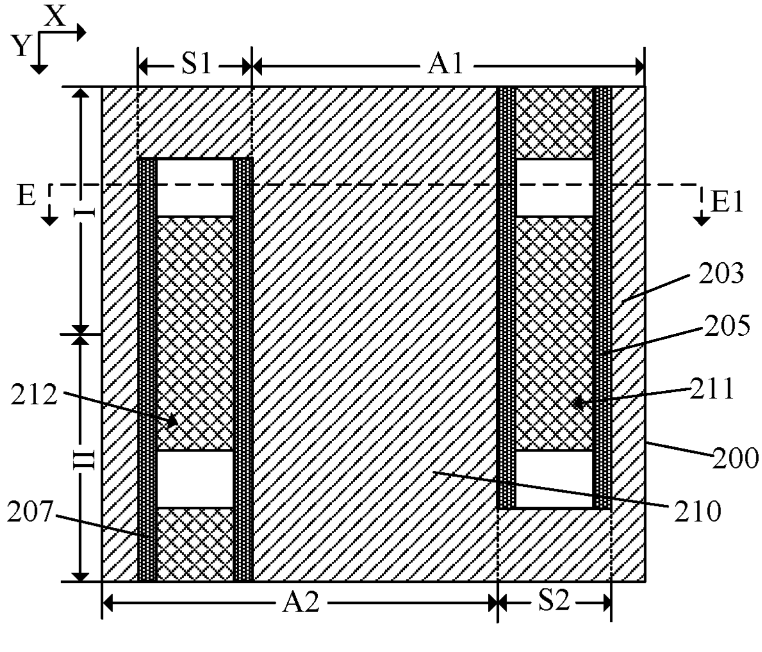

As shown in FIG. 9 which is a top view, and FIG. 10 is a cross-sectional view along the EE1 direction in FIG. 9, the first dummy gate electrode 204 may be removed to form a first gate electrode groove 211 in the interlayer dielectric layer 210; and the second dummy gate electrode 206 may be removed to form a second gate electrode groove 212 in the interlayer dielectric layer 210.

The first dummy gate electrode 204 may be removed by a dry etching process, a wet etching process, or a combination thereof. The second dummy gate electrode 206 may be removed by a dry etching process, a wet etching process, or a combination thereof.

In one embodiment, the process of removing the first dummy gate electrode 204 and the second dummy gate electrode 206 may be a wet etching process, and be in the same process, to reduce process steps.

Subsequently, the first gate electrode may be formed in the first gate electrode groove 211, and the second gate electrode may be formed in the second gate electrode groove 212.

In one embodiment, a first gate electrode oxide layer and a first gate electrode dielectric layer on the first gate electrode oxide layer may be formed between the first active region 201 and the first gate electrode. A second gate electrode oxide layer and a second gate electrode dielectric layer on the second gate electrode oxide layer may be formed between the second active region 202 and the second gate electrode.

Subsequently, a gate electrode material layer may be formed on the surfaces of the first gate electrode groove 211, the second gate electrode groove 212 and the interlayer dielectric layer 210.

Figures 11, 12:
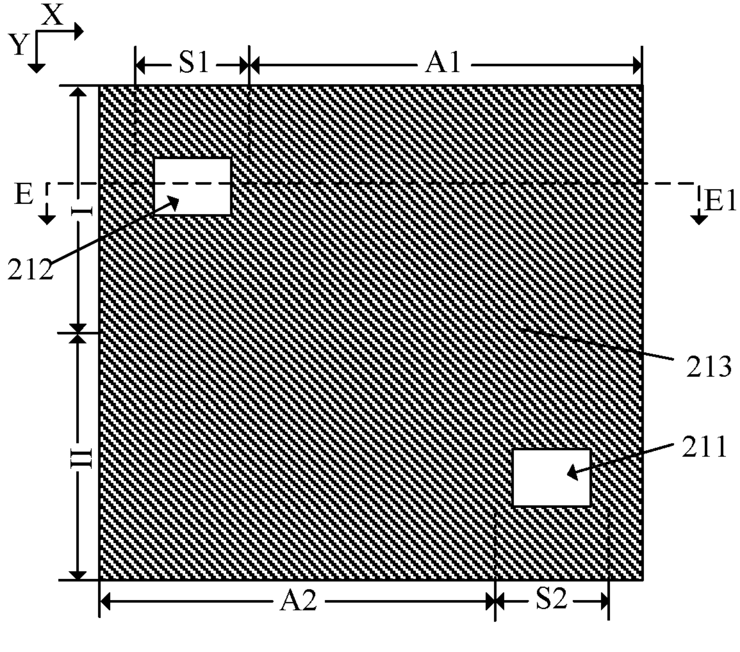

Before forming the gate electrode material layer, in one embodiment, as shown in FIG. 11 which is a top view, and FIG. 12 is a cross-sectional view along the EE1 direction in FIG. 11, a gate electrode oxide material layer may be formed on the surfaces of the first gate electrode groove 211, the second gate electrode groove 212 and the interlayer dielectric layer 210, and a gate electrode dielectric material layer 213 on the gate electrode oxide material layer; and removing a portion of the gate electrode oxide material layer and a portion of the gate electrode dielectric material layer on a portion of the first shared region S1 exposed by the second gate electrode groove 212.

In one embodiment, the gate electrode oxide material layer may be formed by an in-situ water gas generation process, and may be made of a material including SiON which is used to improve the interface state between the high-K dielectric material and the substrate silicon.

The gate electrode dielectric material layer 213 may be made of a material including a high-K dielectric material. The high-K dielectric material refers to a dielectric material with a dielectric constant greater than 3.9. In one embodiment, the gate electrode dielectric material layer 213 may be made of a material including $HfO_2$.

Removing the portion of the gate electrode oxide material layer and the portion of the gate electrode dielectric material layer 213 on the first shared region S1 exposed by the second gate electrode groove 212 may be beneficial to increase the connection between the subsequently formed first gate electrode and the shared regions S1.

The portion of the gate electrode oxide material layer and the portion of the gate electrode dielectric material layer 213 on the first shared region S1 exposed by the second gate electrode groove 212 may be removed by a wet etching process.

The portion of the gate electrode dielectric material layer 213 on the first shared region S1 exposed by the second gate electrode groove 212 may be removed by using process parameters including: an etching solution including a mixed solution of hydrofluoric acid solution, hydrochloric acid solution, and alcohol solution. The ratio of hydrofluoric acid solution, hydrochloric acid solution and alcohol solution may range from 1:1:99 to 1:20:80. Among them, the concentration of the hydrofluoric acid solution may be 1% to 10%, the concentration range of the hydrochloric acid solution may be 10% to 40%, and the concentration range of the alcohol solution may be 50% to 99%. In one embodiment, specifically, the ratio of hydrofluoric acid solution, hydrochloric acid solution and alcohol solution may be 1:10:89.

The portion of the gate electrode oxide material layer on the first shared region S1 exposed by the second gate electrode groove 212 may be removed by using process parameters including an etching solution of hydrofluoric acid solution and the concentration of the hydrofluoric acid solution may be 1% to 10%.

In one embodiment, after forming the gate electrode oxide material layer and the gate electrode dielectric material layer 213, a portion of the gate electrode oxide material layer and a portion of the gate electrode dielectric material layer 213 on the second shared region S2 exposed by the first gate electrode groove 211 may be also removed. The portion of the gate electrode oxide material layer and the portion of the gate electrode dielectric material layer 213 on the second shared region S2 exposed by the first gate electrode groove 211 may be removed to increase the conduction between the subsequently formed second gate electrode and the second shared region S2.

Specifically, the portion of the gate electrode oxide material layer and the portion of the gate electrode dielectric material layer 213 on the first shared region S1 exposed by the second gate electrode groove 212, and the portion of the gate electrode oxide material layer and the portion of the gate electrode dielectric material layer 213 on the second shared region S2 exposed by the first gate electrode groove 211, may be removed in the same process, which is beneficial to save process steps.

Specifically, the portion of the gate electrode oxide material layer and the portion of the gate electrode dielectric material layer 213 on the first shared region S1 exposed by the second gate electrode groove 212, and the portion of the gate electrode oxide material layer and the portion of the gate electrode dielectric material layer 213 on the second shared region S2 exposed by the first gate electrode groove 211, may be removed by: forming a pattern layer on the surfaces of the first gate electrode groove 211, the second gate electrode groove 212, and the interlayer dielectric layer 210, where the pattern layer exposes the gate electrode oxide material layer and the gate electrode dielectric material layer 213 on the first shared region S1 and the second shared region S2; and etching the gate electrode oxide material layer and the gate electrode dielectric material layer 213 using the pattern layer as a mask.

Figure 13:
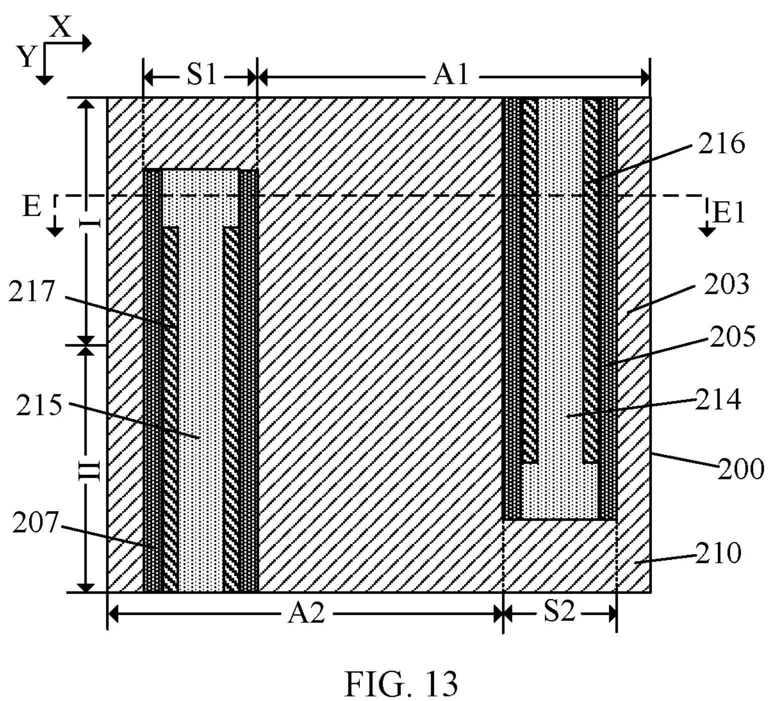
Figure 14:
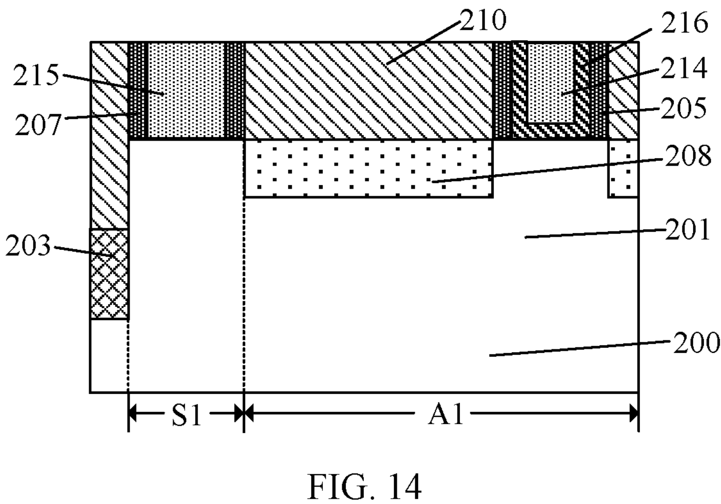
Figure 15:
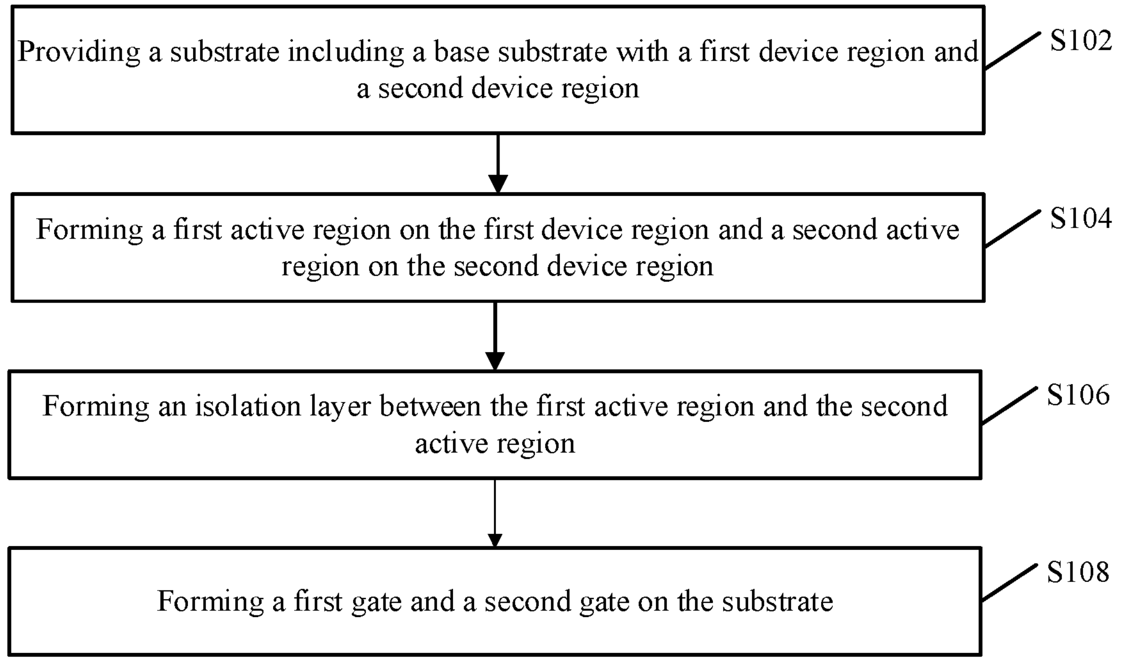
FIG. 15 illustrates an exemplary method for forming a semiconductor structure according to various disclosed embodiments of the present disclosure.

As shown in FIG. 13 which is a top view, and FIG. 14 is a cross-sectional view along the EE1 direction in FIG. 13, a gate electrode material layer may be formed on the surfaces of the first gate electrode groove 211, the second gate electrode groove 212, and the interlayer dielectric layer 210; and then the gate electrode material layer may be planarized until exposing the surface of the interlayer dielectric layer 210, to form the first gate electrode 214 and the second gate electrode 215 from the gate electrode material layer.

The second gate electrode 215 may extend to the surface of the first shared region S1, and may be electrically connected to the first active region 201 at the device layer. The space in the dielectric layer on the upper layer of the device layer may not be occupied. Therefore, the arrangement of metal interconnection wirings in the back-end process may not be affected and the device density may be improved.

In one embodiment, the second gate electrode 215 of the second pull-up transistor may be located on the first shared region S1 to connect the first source/drain layers 208 of the first pull-up transistor with the second gate electrode 215 of the second pull-up transistor.

Further, the first gate electrode 214 may extend to the surface of the second shared region S2, and the first gate electrode 214 may be electrically connected to the second active region 202 at the device layer, without occupying the space of the dielectric layer on the upper layer of the device layer. Therefore, the arrangement of metal interconnection wirings in the back-end process may not be affected and the device density may be improved.

Specifically, the first gate electrode 214 of the first pull-up transistor may be located on the second shared region S2, to electrically connect the second source/drain layers 209 of the second pull-up transistor with the first gate electrode 214 of the first pull-up transistor.

In one embodiment, the gate electrode dielectric material layer and the gate electrode oxide material layer may be planarized. Therefore, a first gate electrode oxide layer may be formed from the gate electrode oxide material layer in the first gate electrode groove 211, a first gate electrode dielectric layer 216 may be formed from the gate electrode dielectric material layer in the first gate electrode groove 211, a second gate electrode oxide layer may be formed from the gate electrode oxide material layer in the second gate electrode groove 212, and a second gate electrode dielectric layer 217 may be formed from the gate electrode dielectric material layer in the second gate electrode groove 212.

The first gate electrode 214 may be made of a material including metal or its derivatives. The metal and its derivatives may include titanium nitride, tantalum nitride, titanium, aluminum, tungsten, copper, lanthanide metal oxides or a combination thereof. The second gate electrode 215 may be made of a material including metal or its derivatives. The metal and its derivatives may include titanium nitride, tantalum nitride, titanium, aluminum, tungsten, copper, lanthanide metal oxides or a combination thereof.

In one embodiment, after forming the first gate electrode 214 and the second gate electrode 215, a first dielectric layer (not shown in the figure) may be formed on the interlayer dielectric layer 210, and the first dielectric layer may include a plurality of contact layers (not shown in the figure). The plurality of contact layers may be respectively located on the surfaces of the first gate electrode 214, the second gate electrode 215, the first source/drain layers 208, and the second source/drain layers 209. After forming the first dielectric layer, a second dielectric layer (not shown in the figure) may be formed on the first dielectric layer, and a metal interconnection layer may be formed in the second dielectric layer (not shown in the figure). The metal interconnection layer may be electrically connected to the plurality of contact layers. The plurality of contact layers may be used to connect the device layer and the upper metal interconnection layer.

The present disclosure also provides a semiconductor structure. As shown in FIG. 13 and FIG. 14, in one embodiment, the semiconductor structure may include a substrate, a first active region 201, a second active region 202, an isolation layer 203, a first gate electrode 214, and a second gate electrode 215. The substrate may include a base substrate 200, and the base substrate 200 may include a first device region I and a second device region II adjacent to each other. The first active region 201 may be located in the first device region I and the second active region 202 may be located in the second device region II. The isolation layer 203 may be located between the first active region 201 and the second active region 202. The first active region 201 and the second active region 202 may extend along the first direction X. The first active region 201 may include a first functional region A1 and a first shared region S1. The first gate electrode 214 and the second gate electrode 215 may be located on the substrate. The first gate electrode 214 and the second gate electrode 215 may be parallel to the second direction Y, where the first direction X and the second direction Y are perpendicular to each other. The first gate electrode 214 may be located on the first device region I and on a portion of the surface of the first active region 201. The second gate electrode 215 may be located on the second device region II and on a portion of the surface of the second active region 202. The second gate electrode 215 may also extend to the surface of the first shared region S1.

The second gate electrode 215 may extend to the surface of the first shared region S1, and may be electrically connected to the first active region 201 at the device layer. The space in the dielectric layer on the upper layer of the device layer may not be occupied. Therefore, the arrangement of metal interconnection wirings in the back-end process may not be affected and the device density may be improved.

In one embodiment, the second active region 202 may include a second functional region A2 and a second shared region S2. The first gate electrode 214 may extend to the surface of the second shared region S2.

The first gate electrode 214 may extend to the surface of the second shared region S2, and the first gate electrode 214 may be electrically connected to the second active region 202 at the device layer, without occupying the space of the dielectric layer on the upper layer of the device layer. Therefore, the arrangement of metal interconnection wirings in the back-end process may not be affected and the device density may be improved.

In one embodiment, the semiconductor structure may further include: first source/drain layers 208 in the first active region 201 located on both sides of the first gate electrode 214. The first active region below the first gate electrode may include a first channel layer between the adjacent first source/drain layers. The semiconductor structure may further include second source/drain layers 209 in the second active region 202 located on both sides of the second gate electrode 215, and the second active region may include a second channel layer below the second gate electrode and between adjacent second source and drain layers.

In one embodiment, the semiconductor structure may further include an interlayer dielectric layer 210, and the first gate electrode 214 and the second gate electrode 215 may be disposed in the interlayer dielectric layer 210. The semiconductor structure may further include a first dielectric layer (not shown in the figure) on the interlayer dielectric layer 210, and the first dielectric layer may include a plurality of contact layers (not shown in the figure). The plurality of contact layers may be respectively located on the surfaces of the first gate electrode 214, the second gate electrode 215, the first source/drain layers 208, and the second source/drain layers 209. The semiconductor structure may further include a second dielectric layer (not shown in the figure) on the first dielectric layer, and a metal interconnection layer may be formed in the second dielectric layer (not shown in the figure). The metal interconnection layer may be electrically connected to the plurality of contact layers. The plurality of contact layers may be used to connect the device layer and the upper metal interconnection layer.

The first gate electrode 214 may be made of a material including metal or its derivatives. The metal and its derivatives may include titanium nitride, tantalum nitride, titanium, aluminum, tungsten, copper, lanthanide metal oxides or a combination thereof. The second gate electrode 215 may be made of a material including metal or its derivatives. The metal and its derivatives may include titanium nitride, tantalum nitride, titanium, aluminum, tungsten, copper, lanthanide metal oxides or a combination thereof.

In the semiconductor structure and its fabrication method provided by various embodiments of the present disclosure, the first active region may include the first functional region and the first shared region. The second gate electrode may extend to the surface of the first shared region, and the second gate electrode and the first active region may be electrically connected in the device layer without occupying the space of the dielectric layer on the upper layer of the device layer. Therefore, the arrangement of metal interconnection wires in the subsequent process may not be affected, which may be beneficial to increase the device density. Further, the second active region includes the second functional region and the second shared region, and the first gate electrode may extend to the surface of the second shared region. The first gate electrode and the second active region may be electrically connected in device layer without occupying the space of the dielectric layer on the upper layer of the device layer. Therefore, the arrangement of metal interconnection wires in the subsequent process may not be affected, which may be beneficial to increase the device density.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor structure, comprising:

a substrate including a base substrate, the base substrate including a first device region and a second device region;

a first active region on the first device region and a second active region on the second device region;

an isolation layer between the first active region and the second active region; and a first gate electrode and a second gate electrode on the substrate, wherein:

the first active region and the second active region extend along a first direction;

the first active region includes a first functional region and a first shared region;

the first gate electrode and the second gate electrode are parallel to a second direction, wherein the first direction and the second direction are perpendicular to each other;

the first gate electrode is located on the first device region and on a portion of a surface of the first active region;

the second gate electrode is located on the second device region and on a portion of a surface of the second active region; and the second gate electrode also extends to a surface of the first shared region, and the second gate electrode is physically in contact with the first shared region.

2. The structure according to claim 1, wherein:

the second active region includes a second functional region and a second shared region;

and the first gate electrode also extends to a surface of the second shared region.

3. The structure according to claim 1, further comprising:

first source/drain layers in the first active region at two sides of the first gate electrode;

a first channel layer in the first active region under the first gate electrode and between the adjacent first source/drain layers;

second source/drain layers in the second active region at two sides of the second gate electrode; and a second channel layer in the second active region under the second gate electrode and between the adjacent second source/drain layers.

4. The structure according to claim 3, further comprising:

an interlayer dielectric layer on the substrate, wherein the first gate electrode and the second gate electrode are located in the interlayer dielectric layer;

a first dielectric layer on the interlayer dielectric layer, where the first dielectric layer includes a plurality of contact layers respectively located on surfaces of the first gate electrode, the second gate electrode, the first source/drain layers, and the second source/drain layers;

a second dielectric layer located on the first dielectric layer; and a metal interconnection layer inside the second dielectric layer, wherein the metal interconnection layer and the plurality of contact layers are electrically connected.

5. The structure according to claim 1, wherein:

the first gate electrode is made of a material including metal or its derivatives, wherein the metal or its derivatives include titanium nitride, tantalum nitride, titanium, aluminum, tungsten, copper, lanthanide metal oxides or a combination thereof; and the second gate electrode is made of a material including metal or its derivatives, wherein the metal or its derivatives include titanium nitride, tantalum nitride, titanium, aluminum, tungsten, copper, lanthanide metal oxides or a combination thereof.

6. The semiconductor according to claim 1, wherein The second gate electrode is electrically connected to the first active region.

7. A fabrication method of a semiconductor structure, comprising:

providing a substrate including a base substrate, the base substrate including a first device region and a second device region;

forming a first active region on the first device region and a second active region on the second device region;

forming an isolation layer between the first active region and the second active region; and forming a first gate electrode and a second gate electrode on the substrate, wherein:

the first active region and the second active region extend along a first direction;

the first active region includes a first functional region and a first shared region;

the first gate electrode and the second gate electrode are parallel to a second direction, wherein the first direction and the second direction are perpendicular to each other;

the first gate electrode is located on the first device region and on a portion of a surface of the first active region;

the second gate electrode is located on the second device region and on a portion of a surface of the second active region; and the second gate electrode also extends to a surface of the first shared region, and the second gate electrode is physically in contact with the first shared region.

8. The method according to claim 7, further comprising:

forming first source/drain layers in the first active region at two sides of the first gate electrode, wherein there is a first channel layer in the first active region under the first gate electrode and between the adjacent first source/drain layers;

forming second source/drain layers in the second active region at two sides of the second gate electrode, wherein there is a second channel layer in the second active region under the second gate electrode and between the adjacent second source/drain layers, wherein:

forming the first source/drain layers, the second source/drain layers, the first gate electrode, and the second gate electrode includes:

forming a first dummy gate electrode and a second dummy gate electrode on the substrate, wherein:

the first dummy gate electrode and the second dummy gate electrode are parallel to the second direction;

the first dummy gate electrode is located on the first device region and a portion of a surface of the first active region;

the second dummy gate electrode is located on the second device region and a portion of a surface of the second active region; and the second dummy gate electrode also extends to the surface of the first shared region;

forming the first source/drain layers in the first active region at two sides of the first dummy gate electrode;

forming the second source/drain layers in the second active region at two sides of the second dummy gate electrodes;

after the formation of the first source/drain layers and the second source/drain layers, forming an interlayer layer on the surface of the substrate, wherein the interlayer dielectric layer exposes the top surfaces of the first dummy gate electrode and the second dummy gate electrode; and after forming the interlayer dielectric layer, using the first gate electrode to replace the first dummy gate electrode a dummy gate electrode and using the second gate electrode to replace the second dummy gate electrode.

9. The method according to claim 8, after forming the first gate electrode and the second gate electrode, further comprising:

forming a first dielectric layer on the interlayer dielectric layer, wherein the first dielectric layer includes a plurality of contact layers respectively located on the surfaces of the first gate electrode, the second gate electrode, the first source/drain layers, and the second source/drain layers; and after forming the first dielectric layer, forming a second dielectric layer on the first dielectric layer, wherein:

the second dielectric layer includes a metal interconnection layer; and the metal interconnection layer is electrically connected to the plurality of contact layers.

10. The method according to claim 8, wherein using the first gate electrode to replace the first dummy gate electrode a dummy gate electrode and using the second gate electrode to replace the second dummy gate electrode includes:

removing the first dummy gate electrode to form a first gate electrode groove in the interlayer dielectric layer;

removing the second dummy gate electrode to form a second gate electrode groove in the interlayer dielectric layer; and forming the first gate electrode in the first gate electrode groove and the second gate electrode in the second gate electrode groove.

11. The method according to claim 10, wherein forming the first gate electrode and the second gate electrode includes:

forming a gate electrode material layer on surfaces of the first gate electrode groove, the second gate electrode groove, and the interlayer dielectric layer; and planarizing the gate electrode material layer to form the first gate electrode in the first gate electrode groove and the second gate electrode in the second gate electrode groove.

12. The method according to claim 11, further comprising:

forming a first gate electrode oxide layer between the first source/drain layers and the first gate electrode, and a first gate electrode dielectric layer on the first gate electrode oxide layer; and forming a second gate electrode oxide layer between the second source/drain layers and the second gate electrode, and a second gate electrode dielectric layer on the second gate electrode oxide layer.

13. The method according to claim 12, wherein forming the first gate electrode oxide layer, the first gate electrode dielectric layer, the second gate electrode oxide layer, and the second gate electrode dielectric layer includes:

before forming the gate electrode material layer, forming a gate electrode oxide material layer on the surfaces of the first gate electrode groove, the second gate electrode groove and the interlayer dielectric layer, and forming a gate electrode dielectric material layer on the gate electrode oxide material layer;

removing a portion of the gate electrode oxide material layer and a portion of the gate electrode dielectric material layer on the first shared region exposed by the second gate electrode groove; and after forming the gate electrode material layer, planarizing the gate electrode dielectric material layer and the gate electrode oxide material layer until the interlayer dielectric layer is exposed, such that the first gate electrode oxide layer is formed from the gate electrode oxide material layer in the first gate electrode groove, the first gate electrode dielectric layer is formed from the gate electrode dielectric material layer in the first gate electrode groove, the second gate electrode oxide layer is formed from the gate electrode oxide material layer in the second gate electrode groove, and the second gate electrode dielectric layer is formed from the second gate electrode dielectric material layer in the second gate electrode groove.

14. The method according to claim 13, wherein:

the portion of the gate electrode oxide material layer and the portion of the gate electrode dielectric material layer on the first shared region exposed by the second gate electrode groove are removed by a wet etching process.

15. The method according to claim 14, wherein:

the portion of the gate electrode dielectric material layer on the first shared region exposed by the second gate electrode groove is removed using an etching solution including a mixed solution of hydrofluoric acid solution, hydrochloric acid solution and alcohol solution, wherein the ratio range of hydrofluoric acid solution, hydrochloric acid solution and alcohol solution is about 1:1:99 to about 1:20:80, concentration of the hydrofluoric acid solution is about 1% to about 10%, concentration of the hydrochloric acid solution is about 10% to about 40%, and concentration of the alcohol solution is about 50% to about 99%.

16. The method according to claim 13, wherein:

the second active region includes a second functional region and a second shared region; and the first gate electrode further extends to a surface of the second shared region.

17. The method according to claim 16, after forming the gate electrode oxide material layer and the gate electrode dielectric material layer, further comprising: removing a portion of the gate electrode oxide material layer and a portion of the gate electrode dielectric material layer on the second shared region exposed by the first gate electrode groove.

18. The method according to claim 7, further comprising forming an isolation layer between the first active region and the second active region.

19. The method according to claim 18, wherein:

a top surface of the isolation layer is lower than top surfaces of the first active region and the second active region; and the first active region, the second active region, and the isolation layer are formed by:

etching the substrate to form the first active region, the second active region, and a groove between the first active region and the second active region;

forming a dielectric material layer in the groove; and etching back the dielectric material layer to form the isolation layer.

20. The method according to claim 7, wherein:

the first gate electrode is made of a material including metal or its derivatives, wherein the metal or its derivatives include titanium nitride, tantalum nitride, titanium, aluminum, tungsten, copper, lanthanide metal oxides or a combination thereof; and the second gate electrode is made of a material including metal or its derivatives, wherein the metal or its derivatives include titanium nitride, tantalum nitride, titanium, aluminum, tungsten, copper, lanthanide metal oxides or a combination thereof.

* * * * *